United States Patent
Barath et al.

(10) Patent No.: US 7,869,607 B2
(45) Date of Patent: Jan. 11, 2011

(54) QUIET ACTIVE FAN FOR SERVERS CHASSIS

(75) Inventors: Yossi Barath, Herzelia (IL); Micahel Surov, Tel Aviv (IL); Alon Slapak, St. Mazor (IL); Itai Michael Itnati, Ramat Gan (IL)

(73) Assignee: Silentium Ltd., Rehovot (IL)

(*) Notice: Subject to any disclaimer, the term of this patent is extended or adjusted under 35 U.S.C. 154(b) by 81 days.

(21) Appl. No.: 11/606,010

(22) Filed: Nov. 30, 2006

(65) Prior Publication Data

US 2007/0223715 A1    Sep. 27, 2007

Related U.S. Application Data

(60) Provisional application No. 60/778,090, filed on Mar. 2, 2006, provisional application No. 60/778,091, filed on Mar. 2, 2006.

(51) Int. Cl.
*G10K 11/16* (2006.01)

(52) U.S. Cl. .................. 381/71.3; 381/71.1; 381/71.11

(58) Field of Classification Search ....... 381/71.1–71.9, 381/71.11–71.14, 96, 83; 181/201, 206, 181/269, 266; 379/406.01, 406.05, 406.08
See application file for complete search history.

(56) References Cited

U.S. PATENT DOCUMENTS

| | | | |
|---|---|---|---|
| 2,091,774 A | 8/1937 | Weiland | |
| 4,665,549 A | 5/1987 | Eriksson et al. | |
| 5,377,275 A | 12/1994 | Suzuki | |
| 5,511,127 A | 4/1996 | Warnaka | |
| 5,606,622 A | 2/1997 | Christenson | |
| 6,078,671 A * | 6/2000 | Kawanishi et al. | 381/71.5 |
| 6,891,347 B2 | 5/2005 | Dobbs et al. | |
| 7,017,702 B2 * | 3/2006 | Gunby | 180/291 |
| 7,017,707 B2 * | 3/2006 | Zia et al. | 181/268 |
| 7,161,801 B2 | 1/2007 | Chen et al. | |
| 7,167,363 B1 | 1/2007 | Cushman et al. | |
| 7,317,801 B1 * | 1/2008 | Amir | 381/71.1 |
| 7,353,908 B1 * | 4/2008 | French | 181/206 |
| 2003/0107873 A1 | 6/2003 | Van Gaal | |
| 2003/0123675 A1 | 7/2003 | Culman et al. | |
| 2005/0170770 A1 | 8/2005 | Johnson et al. | |

FOREIGN PATENT DOCUMENTS

| | | |
|---|---|---|
| EP | 1 414 021 | 4/2004 |
| WO | WO 2005/027338 | 3/2005 |

OTHER PUBLICATIONS www.worksafe.wa.gov.au/newsite/worksafe/default.html.
http:\\en.wikibooks.org/wiki/Acoustics/Noise_from_Cooling_Fans.
International Search Report for PCT/IL07/00269 dated Sep. 22, 2008.
Search Report and Written Opinion for PCT/IL07/00270 mailed on Sep. 16, 2008.

* cited by examiner

*Primary Examiner*—Devona E Faulk
*Assistant Examiner*—Disler Paul
(74) *Attorney, Agent, or Firm*—Shiloh et al.

(57) ABSTRACT

An Active Muffler in the form of a duct having two open ends for conveying air from a within a cabinet to outside the cabinet. A fan or blower is incorporated in the duct. An Automatic Noise Control (ANC) unit is associated with the duct, and at least one microphone and at least one speaker are incorporated in to the duct for noise-reduction. An outer portion of the duct may be sound-absorbing material. the ANC unit may cause noise to be shifted to a frequency that can be absorbed by the sound-absorbing material.

29 Claims, 4 Drawing Sheets

Active Linear Muffler (ALM)

Active Angular Muffler (AAM)

ns to reduce noise by passive treatment.

QUIET ACTIVE FAN FOR SERVERS CHASSIS

CROSS-REFERENCE TO RELATED APPLICATIONS

The present application claims the benefit of U.S. Provisional Application No. 60/778,090, which was filed in the U.S. Patent and Trademark Office on Mar. 2, 2006, and U.S. Provisional Application No. 60/778,091 which was filed in the U.S. Patent and Trademark Office on Mar. 2, 2006. These applications are incorporated herein by reference in their entirety.

Cross-reference is made to commonly-owned, co-pending U.S. patent application Ser. No. 11/606,019, entitled "Soundproof Climate Controlled Rack", which was filed in the U.S. Patent and Trademark Office on Nov. 30, 2006.

TECHNICAL FIELD

The disclosure relates to cabinets for mounting electronic equipment (referred to herein as "blade chassis") and, more particularly, to controlling noise generated within a blade chassis.

BACKGROUND

Noise in general, and tonal noise in particular is very annoying. Low-frequency noise is very penetrating, travels very long distances and is difficult to attenuate using traditional passive control measures.

Passive noise control technology, which usually involves using absorptive materials or noise partitions, enclosures, barriers and silencers, can be bulky, ineffective and rather expensive at low frequencies. Active Noise Control (ANC), on the other hand, can be very efficient and relatively cheaper in reducing low-frequency noise.

Active Noise Control (ANC) is a technology using noise to reduce noise. It is based on the principle of superposition of sound waves. Generally, sound is a wave is travelling in space. If another, second sound wave having the same amplitude but opposite phase to the first sound wave can be created, the first wave can be totally cancelled. The second sound wave is named "antinoise". Although the idea of ANC is not new, its practical application had to wait for the recent development of sufficiently fast electronic control technology.

A basic feed-forward active noise control system generally consists of a reference sensor (microphone), an electronic controller, a loudspeaker and an error sensor (microphone). The reference microphone picks up the information of the primary noise field and sends it to the electronic controller; the controller then drives the control loudspeaker to radiate the antinoise; the error microphone examines the control performance and modulates the controller for the best result.

An example of an active noise control system and method may be found in commonly-owned Patent Publication No. WO 2005/027338 ("388"). As shown and described therein, an active noise control (ANC) system may include an acoustic sensor (typically a microphone) to sense the noise energy and/or wave amplitude of a noise pattern produced by a noise source. The ANC system may also include an acoustic transducer (for example a speaker), and a controller to control the speaker to produce a noise destructive pattern to reduce or cancel the noise energy and/or wave amplitude of the noise pattern, for example within a reduced-noise zone. The controller may include an estimator to produce a predicted noise signal by applying an estimation function to one or more samples of noise signal. A noise error signal may be sensed by a second acoustic sensor (error-sampling microphones positioned in the reduced-noise zone.

Digital adaptive reduction of noise in the time domain is typically performed by sampling the analog output of a microphone that is appropriately positioned to sense the input noise. The sampled analog noise is then converted to digital format via an A/D converter, passed through an adaptive digital filter and then converted back to analog via a D/A converter before being output to a speaker. The analog output of a microphone is utilized as the input to the internal adaptive algorithm within the prior art noise reduction system.

A method of noise cancellation used in prior art systems places the microphone as close to the noise source as possible and the loudspeaker relatively far from the microphone so as to create a delay equal to the time for the noise to travel from the microphone to the speaker. This delay is intentionally created in order to match the internal signal processing time of the noise reduction system. The propagation time for the noise is configured to roughly match and compensate for the signal propagation time within the noise reduction system. This noise reduction method is particularly useful for cancellation of noise in a duct such as an air conditioning duct. The internal signal processing is performed during the time that it takes for the sound waves to travel from the microphone to the loudspeaker.

Another prior art noise reduction technique is to place the speaker close to the noise source rather than far away from it, place a second microphone in the desired quiet zone and adapt a digital filter utilizing the second microphone output. However, this method is useful for canceling repetitive noise only.

As electric/electronic devices get smaller and functional, the noise of cooling devices becomes important. Inside a desktop computer, there may be three (or more) fans. Usually there is a fan on the heat sink of the CPU, in the rear of the power supply unit, on the case ventilation hole, and may be on the graphics card, plus one on the motherboard chipset if it is a very recent one. The noise from a computer that annoys people is mostly due to cooling fans if the hard drive(s) is fairly quiet. When Intel Pentium processors were first introduced, there was no need to have a fan on the CPU at all, but most modern CPUs cannot function even for several seconds without a cooling fan, and some CPU's (such as Intel's Prescott core) have extreme cooling requirements, which often causes more and more noise. The type of fan used in a desktop computer is almost always an axial fan, while centrifugal fans are commonly used in laptop computers.

In many cases, for example, in blade chassis, RAID storage devices and the like (referred to herein as blade chassis) the noise level may exceed the level allowed according to the safety standards and regulations and in radical situations may even harm health. The noise emitted from standard fans normally used in blade chassis is characterized by one or several tones, such as at the low frequencies range ($\leq$1000 Hz). Attempts were made to reduce the noise by passive treatment, for example, IBM 49P2694 Acoustic Attenuation Module. In order to reduce low frequencies range ($\leq$1000 Hz) by means of passive treatment a substantial weight and size of material must be used. For example, to reduce a tone at 500 Hz by about 10 dBA, a muffler of more than 1 meter length and 30 centimeter diameter should be used. The passive means, which are currently being used, are not efficient for reduction of noise at low frequencies, particularly when dealing with fan noise involving airflow which cannot be blocked, without undesirable results (such as heat retention).

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

ANC: Short for active noise control. ANC is achieved by introducing a cancelling "antinoise" wave through an appropriate array of secondary sources. These secondary sources are interconnected through an electronic system using a specific signal processing algorithm for the particular cancellation scheme. ANC is an effective way to attenuate noise that is very difficult and expensive to control using passive means. It has application to a wide variety of problems in manufacturing, industrial operations, and consumer products. See, for example U.S. Pat. No. 5,377,275, incorporated by reference herein in its entirety.

dB: Short for decibel. The decibel (dB) is a measure of the ratio between two quantities, and is used in a wide variety of measurements in acoustics, physics and electronics. While originally only used for power and intensity ratios, it has come to be used more generally in engineering. The decibel is widely used in measurements of the loudness of sound. The decibel unit is commonly used in acoustics to quantify sound levels relative to some 0 dB reference.

dBa: Short for decibels adjusted. Weighted absolute noise power, calculated in dB referenced to 3.16 picowatts (−85 dBm), which is 0 dBa.

RAID: Short for Redundant Array of Independent Disks. The basic concept underlying RAID is that spreading or "striping" data across multiple hard drives provides three benefits over a large single hard drive: redundancy, higher performance, and greater (and easier) scalability. These benefits are particularly compelling in the server environment, where downtime is very expensive, drive subsystem performance is critical to good server performance, and adding storage capacity is often required. The set of disks across which the data is striped is referred to as an array. The RAID controller hides the individual drives and all the striping and redundancy from the rest of the system. It 'fakes' the system and OS into seeing what looks like a single large drive, which in fact is composed of multiple physical hard drives. RAID controllers can support the creation of multiple composite drives. If one disk fails, the system keeps running by accessing the redundant data on the other disk drives. The failed drive can be removed and replaced ("hot plugged") and the new disk drive is automatically reconstructed by using the information on the remaining drives in the RAID group. All of this can be done without any host, operator, or operating system involvement.

Server: A computer on a network that recognizes and responds to client requests for services such as file and print requests or that supports more complex business applications.

Server Blade: Built to slide into existing servers, a server blade is a circuit board that contains components on multiple boards.

Modular: Modular refers to a system design that is made up of separate components that can be connected. In a modular design, different components may be added or replaced without affecting the rest of the components in the system.

UPS: Abbreviation for Uninterruptible Power Supply (UPS). UPSs use generators and/or batteries to power themselves, keeping them operating during power outages and helping to prevent loss of service for mission critical applications.

SUMMARY

According to the disclosure, generally, an air duct for a cooling fan of a blade chassis combines active and passive noise reduction. Various configurations of active mufflers are disclosed, such as active linear muffler (ALM) and active angular muffler (AAM).

According to the disclosure, an active muffler for a server chassis, comprises: a duct having an overall form of a rectangular prism comprising an inner portion for being disposed within the interior of a server chassis and an outer portion for protruding from the server chassis; and the inner portion and the outer portion are contiguous with one another and together comprise the duct for moving air from within the server chassis to without the server chassis. A blower may be disposed within the inner portion for drawing air from within the chassis into the inner portion, and for moving the air through the outer portion to the atmosphere. The active muffler may further comprise passive materials to treat noise, especially at or above 1000 Hz; and an active noise control (ANC) system to reduce noise, especially at or below 1000 Hz.

The active muffler may further comprise a microphone for monitoring noise within the muffler; and a speaker for emitting anti-noise. The microphone may be mounted within the outer portion of the muffler. The microphone may be mounted within the inner portion of the muffler. The speaker may be mounted within the outer portion of the muffler. The speaker may be mounted within the inner portion of the muffler.

The inner and outer portions may be arranged in a linear configuration, thereby forming an active linear muffler (ALM). The inner and outer portions may be arranged in an angular configuration, thereby forming an active angular muffler (ALM).

The inner portion may be formed of sheet metal. The outer portion may be formed of a sound-absorbing material, and may be covered with sheet metal to give it rigidity.

According to the disclosure, a method of reducing noise from a server chassis, comprises: providing a duct comprising an inner portion disposed within the chassis and an outer portion extending outside of the chassis; providing a blower within the inner portion for drawing air from within the chassis into the inner portion, and for moving the air through the outer portion to the atmosphere; forming the duct at least partially of passive materials to treat noise, especially at or above 1000 Hz; and providing an active noise control (ANC) system to reduce noise, especially at or below 1000 Hz. At least one microphone may be provided for monitoring noise within the muffler; and at least one speaker may be provided for emitting anti-noise. The active noise control (ANC) system may be capable of shifting noise to a frequency which can be absorbed by the passive materials.

BRIEF DESCRIPTION OF THE DRAWINGS

Reference will be made in detail to embodiments of the disclosure, examples of which may be illustrated in the accompanying drawing figures (FIGs.). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale for illustrative clarity. Certain ones of the drawings may be stylized for illustrative clarity. For example, an element which is hidden (such as in a perspective view) may be illustrated with solid lines, rather than dashed lines.

DETAILED DESCRIPTION

Figure 1:
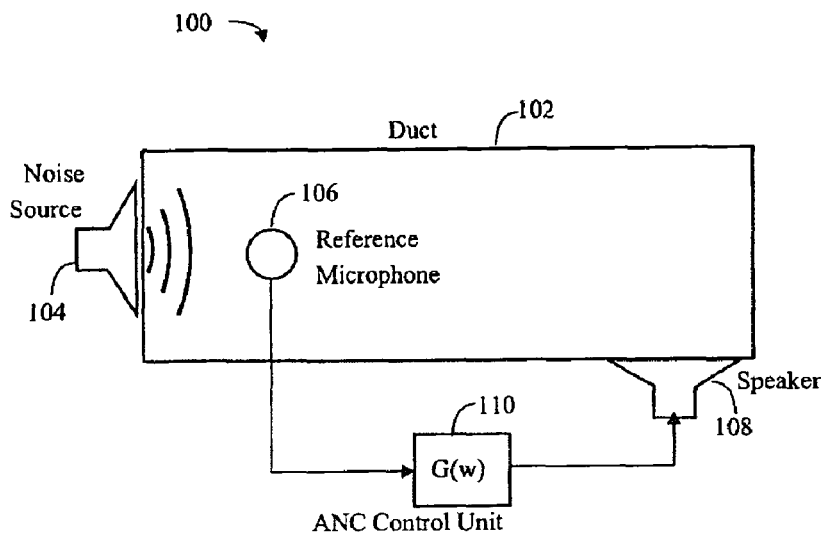
FIG. 1 is a diagram illustrating an ANC system, generally.

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

In some embodiments, there is provided a method for reducing noise in a server chassis such as blade server/center chassis by combining passive and active reduction of noise.

As used herein, a "blade server" may refer to a housing for a number of individual minimally-packaged computer motherboard "blades" or other noise producing devices, often with vibrating or spinning devices which produce continuous frequencies of noise.

There is also provided a device (a Quiet Active Fan) for reducing noise emitted from a fan and/or a blower in a server chassis, the device may include combination of passive and active noise reduction means.

There is also provided a system for reducing noise emitted from a fan and/or a blower in a server chassis, the system may include passive noise reduction means, active noise reduction means and a controller adapted to reduce the effects of a noise source by sensing the acoustic noise field generated by the noise source and generate an input signal therefrom, generate an acoustic output field that is effective to reduce the level of the acoustic noise field, adjust the input signal generated by an input transducer to compensate for the nonlinear characteristics of the input transducer, remove extraneous signals from the input signal so as to generate a signal corresponding to substantially the noise source alone and generating an anti-noise signal opposite in phase to the input signal, the output actuator means generating the acoustic output field from the anti-noise signal.

The device may be an add-on device, which may be installed in or on or associated with the rear side or other side of a server chassis unit. The device may also be a part of the server chassis. The device may also provide heat dissipation as by way of air or other fluids suction, convection or conduction (e.g. movement) using one or more blowers and/or fans. The noise, which is emitted from the fan(s)/blower(s), may be reduced by a combination of passive and active treatment. The passive treatment may include barrier and absorbing materials and may be most effective for the frequency range at or above 1000 Hz. The active treatment may include Acoustic Noise Control (ANC) system and may be most effective for the frequency range at or below 1000 Hz.

The device may include one or more fan(s)/blower(s) depending on the heat dissipating or other requirements, which may be controlled as by a thermo-pressure controller. The controller may be adapted to accelerate or decelerate the velocity of the fan(s)/blower(s) according to the thermal and the pressure parameters required to achieve the optimal heat dissipation.

In addition, the device may include noise reduction elements which may be parted to passive means (for example, barrier materials, absorbing materials, passive construction or any other material known to a person of skill in the art), and active means (as described herein).

ANC System

FIG. 1 illustrates an active noise control (ANC) system 100, generally. The ANC system 100 is shown in conjunction with an elongate, air duct 102 having an inlet end which is open (to the left of the figure) and an outlet end which is open (to the right of the figure). The air duct may 102 may have a round cross-section, or it may have a rectangular cross-section.

Generally, the purpose of the air duct 102 is to convey air from one location to another, from its inlet end to its outlet end. In the context of the present disclosure, the air duct 102 has an additional purpose which is reducing noise which may be emanating from the one location.

A noise source 104 is shown at the inlet end of the air duct 102.

The ANC system 100 includes an acoustic sensor (input transducer, such as a microphone) 106 that receives the noise to be reduced (destructed, suppressed reduced or cancelled). The acoustic sensor 106 may be referred to herein as "reference microphone". The reference microphone 106 may be located anywhere within the duct 102, and may also be located outside of the duct 102.

The ANC system 100 includes an acoustic transducer (output actuator, such as a speaker) 108 that emits destructive (noise-canceling) noise (also referred to as "anti-noise"). The acoustic transducer 108 may be referred to herein simply as "speaker". The speaker 108 may be located anywhere within the duct 102, and may also be located outside of the duct 102.

The ANC system 100 includes a controller (electronic system) 110 which calculates the destructive (noise-canceling) noise to be emitted by the speaker.

Generally, by monitoring the noise from the noise source 104 (using the microphone 106), anti-noise can be calculated by the controller 110 and emitted by the speaker 108 to reduce the noise.

As is known, noise-canceling techniques may include generating anti-noise which is out of phase with the noise generated by the noise source, which can theoretically cancel the noise. Alternatively, anti-noise can be generated which shifts the frequency of the noise being generated by the noise source, such as from a low frequency (such as under 1000 Hz) to a higher frequency (such as over 1000 Hz).

As is known, a second microphone (not shown) can be provided to monitor the results of noise cancellation, at a given, monitored location, and the controller can control the anti-noise which is calculated so that the noise at the monitored location can better be minimized. Such a second microphone is often referred to as "error microphone". One of ordinary skill in the art will recognize this as a control (or feedback) loop situation where a signal is calculated to effect a desired result, the result is monitored, and any deviations from the desired result are taken into account in recalculating the signal so as to better effect the desired result.

Optionally, the controller 110 may also be used to control other instrumentalities which control the temperature and the pressure of the unit.

The Acoustic Noise Control (ANC) system may include an input transducer and an output actuator that are preferably physically located in unitary position, or at least, next to each other in the same location. In one embodiment, the input transducer and the output actuator are a hybrid represented by a single element. The active noise reduction system may be located as close as possible to the noise source as possible and functions to generate the cancellation sound wave with minimum delay with respect to the noise source(s) and minimum reflection or distortion of the noise waveform(s).

The active noise control system, when located very close to the noise source(s), functions to generate synthetic sound waves having a phase preferably opposite that of the noise. Both the noise source and the active noise control system might be situated within an enclosure or may be situated external to an enclosure. In one embodiment, the noise sound wave and the cancellation sound wave spread almost from the same point producing a high amount of noise cancellation. The output power of the cancellation signal is chosen so as to achieve maximum cancellation of the noise sound.

The acoustic cancellation method implemented by the controller may be based on the behavior of acoustic beam patterns in air or other fluids. Cancellation of the noise is achieved in an area far from the noise source while in an area relatively close to the noise source there may be pockets of noise that exist. The length of the quiet zone, as measured from the noise source, is determined by the power of the cancellation signal generated and output by the system. Since the output acoustic beam pattern is dependent on the characteristics of the output actuator and on the main cancellation frequency that is used, the type of output actuator or the angle between a plurality of actuators may need to be varied in order to achieve optimum results for different noise frequencies. The noise reduction method may be capable of achieving effective cancellation of the noise when the surface of the noise source is complex given that the distance from the noise source to the point of cancellation is bigger then the length of the noise source itself.

In addition to sensing sound from the noise source, the system also may detect the sound from the output actuator. The portion of the input signal that is due to the output actuator is removed as by using an echo cancellation technique. If the output and input transducers are acoustically separate elements and there exists acoustic delayed feedback in the system, then using an echo cancellation system may be preferred. Another advantage of the echo cancellation system is the elimination of feedback sound emanating from walls, furniture, etc. and sensed by the input transducer. If there is no delayed time feedback from the output transducer to the input transducer and a directional input transducer is used, then a computation may be performed on the input signal, instead of using an echo cancellation system, to discern the actual noise signal from the input signal.

In addition, the cancellation signal (destructive noise) generated by the output actuator may be reflected from the noise source itself thus adding to the amount of noise present. In order to eliminate this type of noise, a delayed cancellation signal is generated by the system. The delay and phase shift applied to the cancellation signal may be matched to the delay and phase shift associated with the reflection and feedback of the sound from the output actuator.

Figure 2:
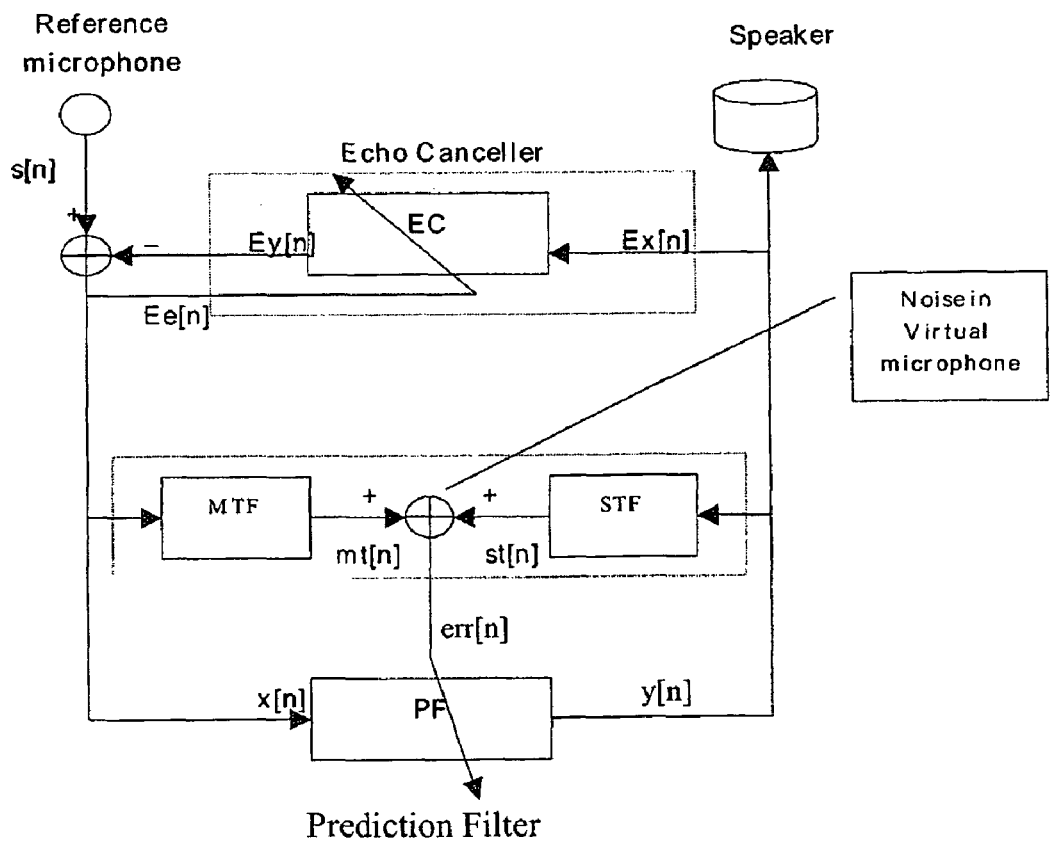
FIG. 2 is a block diagram of an ANC controller, generally, such as for the ANC system of FIG. 1.

Reference is now made to FIG. 2 which illustrates an ANC controller suitable for the ANC system of FIG. 1, generally.

The abbreviations used herein are short for:
EC, echo cancellation
PF, prediction filter
MTF, reference microphone to error microphone transfer function
STF, speaker to error microphone transfer function There is therefore provided an acoustic noise control (ANC) system for reducing the effects of a noise source, including input transducer means for sensing the acoustic noise field generated by the noise source and for generating an input signal therefrom, output actuator means for generating an acoustic output field that is effective to reduce the level of the acoustic noise field, correction means for adjusting the input signal generated by the input transducer to compensate for the nonlinear characteristics of the input transducer and output actuator, echo cancellation means for removing from the input signal a portion of the output of the output actuator means feedback through the input transducer means, the output of the echo cancellation means representing a signal preferably corresponding to substantially the noise source by itself, anti-noise means for generating an anti-noise signal opposite in phase to the input signal, the output actuator means generating the acoustic output field from the anti-noise signal and wherein the input transducer means may be located in relatively close proximity to the output actuator means.

The echo cancellation means (Echo Canceller, EC, FIG. 2) may include a digital filter having a delay line with a number of taps whose total delay time is equivalent to at least a system time delay of the noise reduction system, adaptation means for dynamically adjusting the coefficient values associated with each of the taps of the digital filter and summing means for adding the output of the digital filter with the output of the correction means.

The antinoise means comprises the speaker and may include a variable gain amplifier which is located on the electronic board and which is operative to generate an amplified signal 180 degrees opposite in phase from the input signal and gain control means for dynamically controlling the gain of the variable gain amplifier. The gain control means is adapted to receive a manual input control signal from a user which determines the gain of the variable gain amplifier, the user able to vary the location of a quiet zone generated by the system by varying the input control signal. The input control signal is generated by the user remotely from the system and transmitted to the system via wireless communication means.

The system may further include a low pass filter which is located on the electronic board operative to reduce oscillations present in the system derived from feedback of the acoustic output field to the input transducer. Also, the system may further include delay cancellation means as part of the algorithm executed by the controller for reducing the effect of echo signals caused by the anti-noise means sensed by the input transducer. The delay cancellation means may include a plurality of delay cancellation circuits wherein one or more or each delay cancellation circuit is operative to reduce the effect of the echo caused by previous delay cancellation circuits.

A method for reducing the effects of a noise source may include of sensing the acoustic noise field generated by the noise source and for generating an input signal therefrom, generating an acoustic output field that is effective to reduce the level of the acoustic noise field, adjusting the input signal generated by an input transducer to compensate for any nonlinear characteristics of the input transducer, removing extraneous signals from the input signal so as to generate a signal corresponding to substantially the noise source alone and generating an anti-noise signal opposite in phase to the input signal, the output actuator means generating the acoustic output field from the anti-noise signal.

Figure 3:
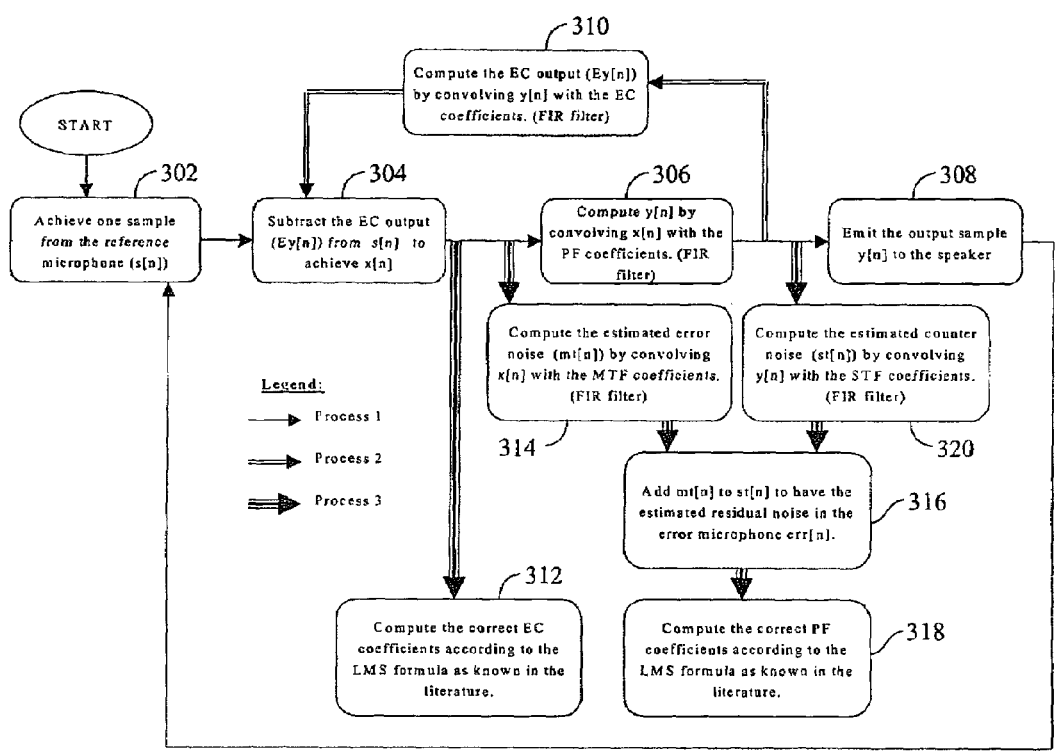
FIG. 3 is a flow chart of a method for reducing the effects of a noise source, such as may be implemented in the ANC controller of FIG. 2.

FIG. 3 illustrates a method for reducing the effects of a noise source. Three processes are illustrated, and are referred to as "Process 1", "Process 2", and "Process 3".

In a first step 302, achieve (acquire) one sample from the reference microphone (s[n]).

In a next step 304, subtract the EC output [Ey[n]] from s[n] to achieve x[n].

The first two steps 302 and 304 are common to all three processes (Process 1, Process 2, Process 3).

Next, in Process 1, in a step 306, compute y[n] by convolving x[n] with the PF coefficients (FIR filter).

Next, in Process 1, in a step 308, emit the output sample y[n] to the speaker.

Next, in Process 1, loop back to the step 302 to achieve another sample from the reference microphone.

After the step 306, in Process 2, in a step 310, compute the EC output (Ey[n]) by convolving y[n] with the EC coefficients (FIR filter), and provide the result to step 304, as shown. The purpose of this step is to estimate and to subtract the destructive noise that is sensed by the reference microphone as a surplus signal. The optimal situation is that the reference microphone senses the source signal only, but the real situation is sensing the destructive signal from the speaker also.

Process 3 is different than either of Process 1 or Process 2 in that it does not loop back.

In Process 3, after the step 304, in a step 312, compute the correct EC coefficients according to the LMS formula, as known in the literature. The purpose of this step is to Track changes in time in the transfer function of the speaker and of the space between the speaker and the reference microphone.

In Process 3, also after the step 304, in a step 314, compute the estimated error noise (mt[n]) by convolving x[n] with the MTF coefficients (FIR filter). Then, in a step 316, add mt[n] to st[n] to have the estimated residual noise in the error microphone err[n]. Then, in a step 318, compute the correct PF coefficients according to the LMS formula, as known in the literature. The purpose of these steps is to Track changes in time in the noise signal characteristic and hence to adjust the required destructive noise.

In Process 3, after the step 306, in a step 320, compute the estimated counter noise (st[n]) by convolving s[n] with the STF coefficients (FIR filter). Then, perform the step 316, as already described. The purpose of these steps is to compute the correction of the PF coefficients as per the well known in the literature XLMS algorithm.

There is disclosed herein a noise limiting system (NLS) which incorporates passive means and active (ANC) technology for reducing noise, particularly for use with a blade chassis.

The passive means may be adapted to reduce noise, especially in the frequencies range of >1000 Hz, while the ANC system may be adapted to reduce noise, especially in the range of <1000 Hz and tones.

The active noise control (ANC) technology may be adapted to achieve up to 10 dBA or more reduction of separated tones, and 5 dBA in a range of frequencies noise.

Figure 4:
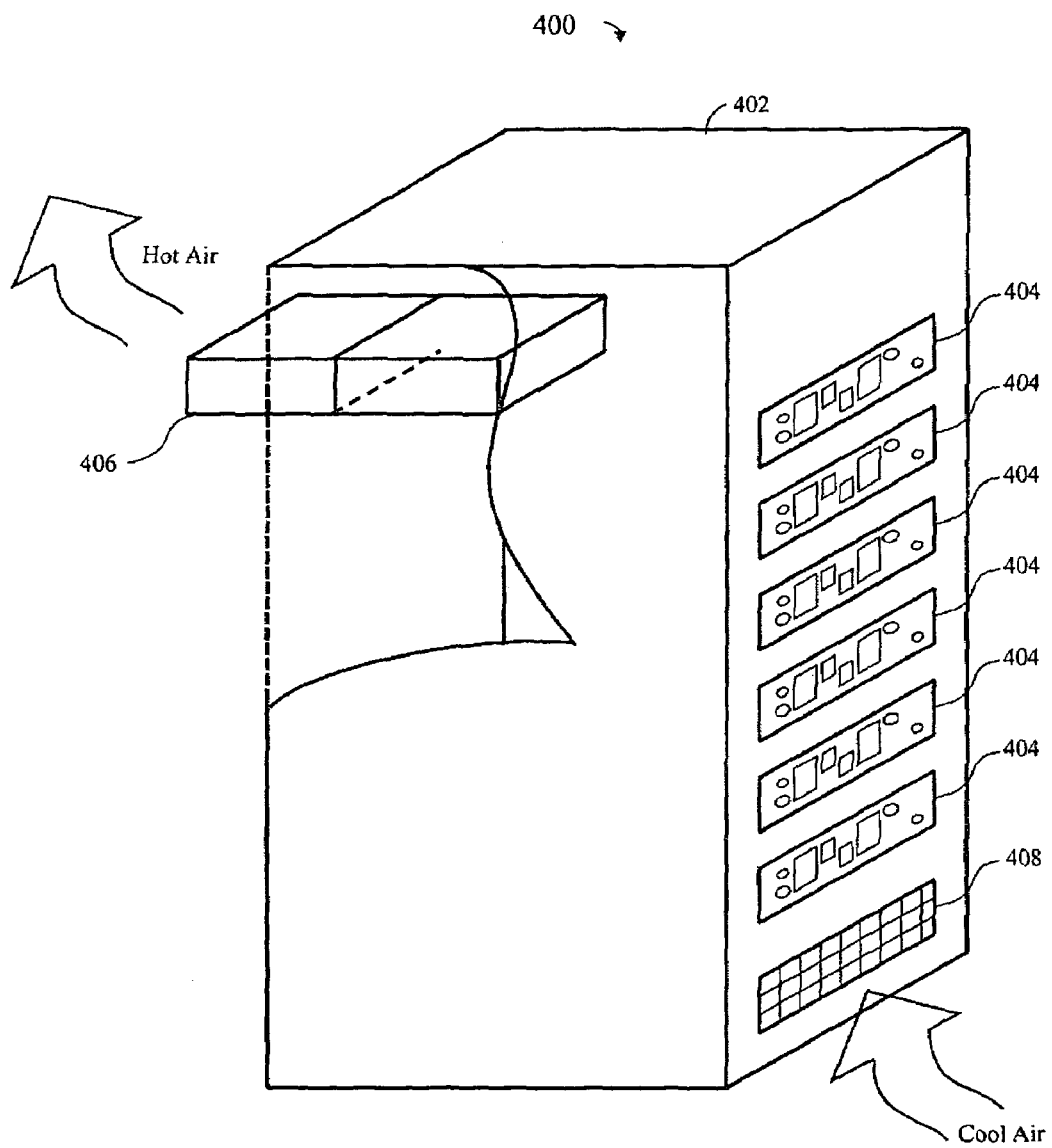
FIG. 4 is a diagram of a cabinet for mounting electronic equipment (referred to herein as "blade chassis"), with an active muffler installed to control noise generated within the blade chassis.

FIG. 4 illustrates a generic blade chassis 400, comprising a cabinet 402 housing a number electronic units 404 which generate heat, when operating. To reduce the temperature within the cabinet 402, an active muffler 406 is provided to remove hot air from within the cabinet, venting it to the outside. As illustrated, the active muffler 406 extends from within the cabinet 402, to without the cabinet 402, and may be located high on the rear wall of the cabinet. An air inlet 408 on the cabinet admits fresh (presumably cool) air to the cabinet, and may be located low on the front surface of the cabinet.

Figure 5:
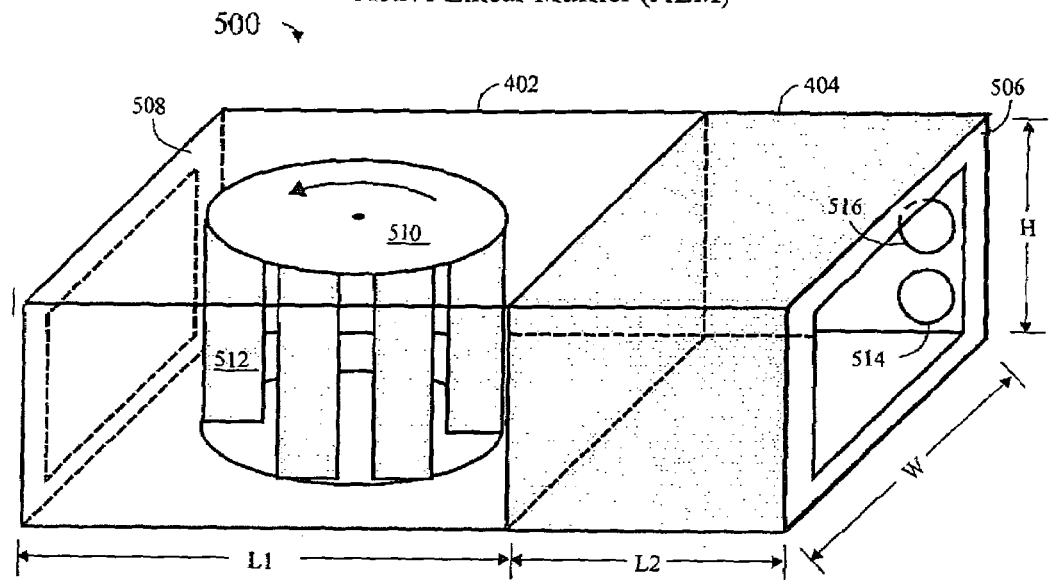
FIG. 5 is a perspective view of an embodiment of an active linear muffler (ALM).

The active muffler 406 generally comprises a duct within which there is a blower or fan (not shown, described hereinbelow) and may be constructed at least partially of noise-absorbing material, as described hereinbelow. The active muffler 406 may be built in several configurations, for example:

FIG. 5 (described in greater detail hereinbelow) illustrates an Active Linear Muffler (ALM), in which the airflow may be directed along a single direction.

Figure 6:
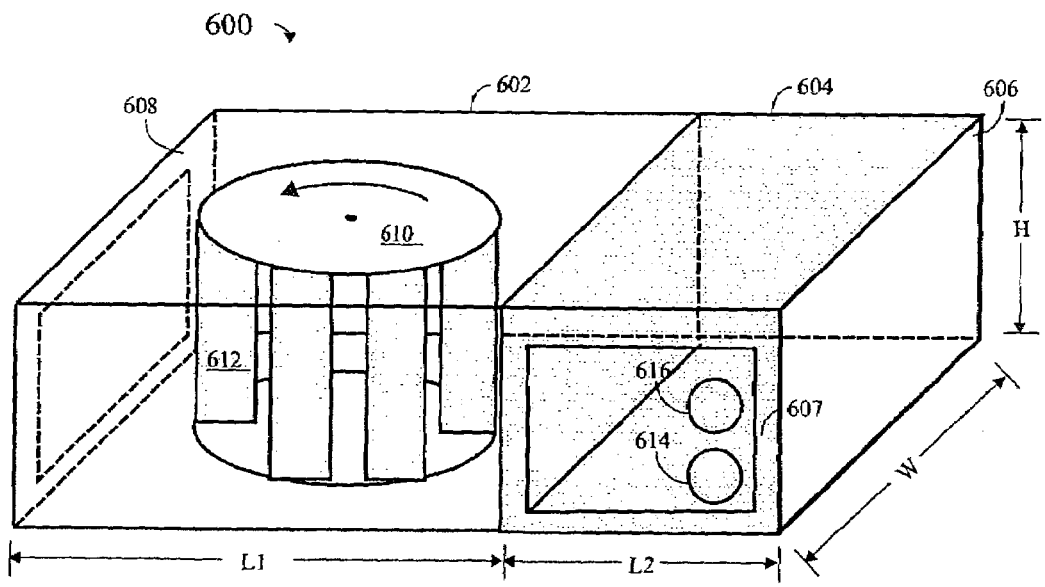
FIG. 6 is a perspective view of an embodiment of an active angular muffler (AAM).

FIG. 6 (described in greater detail hereinbelow) illustrates an Active Angular Muffler (AAM), in which the airflow may be shifted with one or more angle(s) (such right angle(s)).

In both (ALM, AAM) configurations, a ANC microphone may be located in the duct, such as after the blower along the airflow direction, and the speaker may be located at the end of the duct, which exit from the chassis bounds.

The duct may be covered with (or portions of the duct constructed from) one or more absorbing material(s) to reduce noise, especially at the high frequencies ($\geq 1000$ Hz). The thickness and the type of the absorbing materials may be determined according to the fan/blower's or other parameters.

Thermal sensor(s) may be installed in the duct to provide feedback to the controller (such as a microcontroller, microprocessor logic circuits or the like) regarding the temperature of the outgoing air such that the controller may change the fan/blower's velocity if needed. For example, if the temperature is not too high, the fan speed can be lowered, which may result in less fan noise to be cancelled.

The controller may have a communication channel with the chassis or other apparatus for the sake of mutual indication regarding the operation modes, malfunctioning or any other parameter(s).

Two exemplary configurations of an active muffler 406 will now be described. Generally, both active mufflers which will be described are in the form of a duct having two open ends for conveying air from an inner portion of the duct which may receive warm air from within a cabinet (such as 402) to an outer portion of the duct which vents the warm air to outside the cabinet. Generally, both active mufflers may have a fan or blower incorporated in the duct, such as within the inner portion of the duct Generally, both active mufflers may have a microphone (such as 106) and a speaker (108) incorporated within the duct for working with an ANC control unit (such as 110) which may be located outside of the duct. Generally, both active mufflers may have an inner portion which is formed of a rigid material such as sheet metal or plastic, and may have an outer portion which is formed of a sound-absorbing material which may be reinforced (such as covered by) a more rigid material. Generally, both active mufflers combine passive means such as sound-absorbent material to reduce noise with active means such as an ANC system to further reduce noise, including shifting a frequency of the noise into a range which is better absorbed by the sound-absorbent material.

Active Linear Muffler (ALM)

FIG. 5 illustrates an active linear muffler (ALM) 500. Generally, the Active Linear Muffler (ALM) 500 may be based on treating noise by passive and/or active means. The ALM may be an add-on part, which may include the following components:

a blower, passive materials to treat noise, especially at or above 1000 Hz, an active noise control (ANC) system (such as described hereinabove with respect to FIG. 2) to reduce noise, especially at or below 1000 Hz.

The illustrated embodiment of an ALM 500 is generally in the overall form of a rectangular prism comprising a first (or "inside", or "inner") portion 502 which is intended to be disposed within the interior of a rack (or chassis, not shown, compare 402, FIG. 4) and a second (or "outside", or "outer")) portion 404 which is intended to protrude from the rack.

The inner portion 502 is generally in the overall form of a rectangular prism and may have the following dimensions:

length (L1), approximately 250 mm width (W), approximately 205 mm height (H), approximately 100 mm The inner portion may be sized (particularly height and width) to correspond to the size of an air outlet of a cooling unit (fan, blower or vents) of the device (the server).

The outer portion 504 is generally in the overall form of a rectangular prism and may have the following dimensions:

length (L2), approximately 150 mm width (W), approximately 205 mm height (H), approximately 100 mm The inner portion 502 and the outer portion 504 have approximately the same width (W) and height (H), and are aligned lengthwise. The overall length of the ALM 500 may be approximately 400 mm (L1+L2).

A front side (not visible, right as viewed) of the inner portion 502 may be open, and contiguous with a corresponding open rear side (not visible, left as viewed) of the outer portion 504. The inner portion 502 and the outer portion 504 of the ALM 500 are contiguous with one another, in fluid communication with each other, and together comprise a duct (compare 102, 406) for moving air from within a server chassis (see 402) to without the server chassis.

The front side 506 of the outer portion 504 has an "exhaust" opening for exhausting air to the "atmosphere" (the environment external to the rack).

The rear side 508 of the inner portion 502 has an "intake" opening for receiving air from within the chassis. Alternatively, another side (which is neither the rear side or the front side) of the inner portion 502 has (is provided with) the intake opening for receiving air from within the chassis.

A blower (fan) 510 having blower blades 512 is disposed within the inner portion 502, and rotates to move air from the inner portion 502 to the outer portion 504. When the fan 510 is rotating, air is drawn from within the chassis into the inner portion 502, and moved through the outer portion 504 to the atmosphere.

The fan 510 may be an axial fan, in which case the intake opening would be on the back side of the inner portion 502. The fan 510 may be a centrifugal fan, in which case the intake opening would be on the back side of the inner portion 502. Generally, the fan can be any kind of fan or blower.

The inner portion 502 may be made (formed, constricted) of sheet metal, such as 2 mm steel. Plastic is also possible, but may be too stiff. The outer portion 504 may be made (formed, constructed) of a rigid, sound-absorbing material such as 15 mm (thickness) foam (material), covered with a 2 mm steel panel.

A speaker 514 may be mounted within the outer portion 504, near the right side (Or exhaust) opening 506 for the purpose of noise-cancellation, as described hereinabove.

A microphone 516 may be mounted within the outer portion 504, near the right side (or exhaust) opening 506 for the purpose of noise-cancellation, as described hereinabove. Alternative locations for the speaker 514 and the microphone 516 would be anywhere in the ALM 500.

The linear configuration of the ALM 500 minimizes breaking the airflow direction(s). The resulting direct, straight line airflow may be of benefit with regard to thermal performance. Additionally, the relatively short path of the air may reduce the noise reduction performance, relative to the AAM 600, described hereinbelow (because the AAM 600 has a corner resulting in additional length).

Active Angular Muffler (AAM)

FIG. 6 illustrates an active angular muffler (AAM) 600. Whereas the inner and outer portions (502, 504) of the ALM 500 are arranged in a linear configuration, in this example of an AAM 600 the inner and outer portions (602, 604) are arranged in an angular configuration.

Generally, the Active Angular Muffler (AAM) 600 may be based on treating noise by passive and/or active means. The AAM may be an add-on part, which may include the following:

a blower, passive materials to treat noise, especially at or above 1000 Hz (instead of >500 Hz as prior focused, which is also generally true for the ALM 500), an active noise control (ANC) system (such as described hereinabove with respect to FIG. 2) to reduce noise, especially at or below 1000 Hz.

The illustrated embodiment of an ALM 600 is generally in the overall form of a rectangular prism comprising a first (or "inside", or "inner") portion 602 which is intended to be disposed within the interior of a rack (or chassis, not shown, compare 402, FIG. 4) and a second (or "outside", or "outer") portion 604 which is intended to protrude from the rack.

The inner portion 602 is generally in the overall form of a rectangular prism and may have the following dimensions:

length (L1), approximately 250 mm width (W), approximately 205 mm height (H), approximately 100 mm The inner portion may be sized (particularly height and width) to correspond to the size of an air outlet of a cooling unit (fan, blower or vents) of the device (the server).

The outer portion 604 is generally in the overall form of a rectangular prism and may have the following dimensions:

length (L2), approximately 150 mm width (W), approximately 205 mm height (H), approximately 100 mm The inner portion 602 and the outside portion 604 have approximately the same width (W) and height (H), and are aligned lengthwise. The overall length of the AAM 600 may be approximately 400 mm (L1+L2).

A front side (not visible, right as viewed) of the inner portion 602 may be open, and contiguous with a corresponding open rear side (not visible, left as viewed) of the outer portion 604. The inner portion 602 and the outer portion 604 of the AAM 600 are contiguous with one another, in fluid communication with each other, and together comprise a duct (compare 102, 406) for moving air from within a server chassis (see 402) to without the server chassis.

A side surface 607 (which is not the front side 606, compare front end 506 of ALM 500) of the outer portion 604 has an "exhaust" opening for exhausting air to the "atmosphere" (the environment external to the rack).

The rear side 608 of the inner portion 602 has an "intake" opening for receiving air from within the chassis. Alternatively, another side (which is neither the rear side or the front side) of the inner portion 602 has (is provided with) the intake opening for receiving air from within the chassis.

A blower (fan) 610 having blower blades 612 is disposed within the inner portion 602, and rotates to move air from the inner portion 602 to the outer portion 604. When the fan 610 is rotating, air is drawn from within the chassis into the inner portion 602, and moved through the outer portion 604 to the atmosphere.

The fan 610 may be an axial fan, in which case the intake opening would be on the back side of the inner portion 602. The fan 610 may be a centrifugal fan, in which case the intake opening would be on the back side of the inner portion 602. Generally, the fan can be any kind of fan or blower.

The inner portion 602 may be made (formed, constructed) of sheet metal, such as 2 mm steel. Plastic is also possible, but may be too stiff. The outer portion 604 may be made (formed, constructed) of a rigid, sound-absorbing material such as 15 mm (thickness) foam (material), covered with a 2 mm steel panel.

A speaker 614 may be mounted within the outer portion 604, near the right side (or exhaust) opening 606 for the purpose of noise-cancellation, as described hereinabove.

A microphone 616 may be mounted within the outer portion 604, near the right side (or exhaust) opening 606 for the purpose of noise-cancellation, as described hereinabove. Alternative locations for the speaker 614 and the microphone 616 would be anywhere in the ALM 500.

Frugality (less amount of) in passive materials (such as foam) may yield small dimensions and cost reduction while having better performance. This is also generally true for the ALM 500.

The Angular (AAM) configuration may yield a better noise reduction than the Linear (ALM) configuration, since the breaking airflow direction may contribute to a non-negligible noise reduction.

The device (Quiet Active Fan, including either ALM or AAM) may be used in several applications, for example applications that are based on air-cooling systems, which are driven by a fan/blower. These applications may include PC cases, servers cases, racks and more (collectively referred to as "chassis").

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. An add-on active muffler adapted to be installed in a server chassis, the add-on active muffler comprising:
    a duct comprising an inner portion and an outer portion,
    wherein the inner portion is configured to be disposed within an interior of a server chassis,
    wherein the outer portion is configured to protrude from the server chassis,
    wherein the inner portion and the outer portion are contiguous with one another and together comprise the duct for moving air from within the server chassis to without the server chassis; and
    an active noise control (ANC) system to actively reduce one or more effects of a noise source, the active noise control system comprising:
        an input transducer to sense an acoustic noise field generated by the noise source, and to generate from the acoustic noise field an input signal;
        an output actuator to generate an acoustic output field effective to reduce a level of the acoustic noise field;
        a correction unit to adjust the input signal compensate for characteristics of the input transducer and the output actuator;
        an echo canceller to remove from the input signal a portion of the output of the output actuator, which comprises a feedback through the input transducer, wherein an output of the echo cancellation unit represents a signal corresponding to the noise source; and
        an anti-noise generator to generate an anti-noise signal opposite in phase to the input signal by applying an adjustable prediction filer, wherein the prediction filter is adjusted based on a residual noise at a virtual error microphone, which is estimated based on a combination of an estimated error noise at the error microphone and an estimated counter noise at the error microphone,
        wherein the output actuator is to generate the acoustic output field from the anti-noise signal.

2. The add-on active muffler of claim 1, further comprising:
a blower disposed within the inner portion for drawing air from within the server chassis into the inner portion, and for moving the air through the outer portion to the atmosphere.

3. The add-on active muffler of claim 1, further comprising:
passive materials to treat noise, at or above 1000 Hz,
wherein the active noise control (ANC) system is adapted to actively reduce noise at or below 1000 Hz.

4. The add-on active muffler of claim 1, wherein the input transducer comprises a microphone for monitoring noise within the add-on active muffler; and
wherein the anti-noise generator comprises:
    a speaker for emitting anti-noise;
    a variable gain amplifier to generate an amplified signal substantially 180 degrees opposite in phase from the input signal;
    a wireless communication unit to receive a user-generated control signal representing a user command to modify a location of a quiet zone generated by the active noise control (ANC) system; and
    a gain control unit to dynamically control a gain of the variable control amplifier based on said user-generated control signal.

5. The add-on active muffler of claim 4, wherein:
the microphone is mounted within the outer portion of the add-on active muffler.

6. The add-on active muffler of claim 4, wherein:
the microphone is mounted within the inner portion of the add-on active muffler.

7. The add-on active muffler of claim 4, wherein:
the speaker is mounted within the outer portion of the add-on active muffler.

8. The add-on active muffler of claim 4, wherein:
the speaker is mounted within the inner portion of the add-on active muffler.

9. The add-on active muffler of claim 1, wherein:
the inner and outer portions are arranged in a linear configuration, thereby forming an active linear muffler (ALM).

10. The add-on active muffler of claim 1, wherein:
the inner and outer portions are arranged in an angular configuration, thereby forming an active angular muffler (AAM).

11. The add-on active muffler of claim 1, wherein:
the inner portion is formed of sheet metal.

12. The add-on active muffler of claim 1, wherein:
the outer portion is formed of a sound-absorbing material.

13. The add-on active muffler of claim 1, wherein:
the estimated error noise at the error microphone is estimated by applying a reference-microphone-to-error-microphone transfer function to the input signal, and wherein the estimated counter noise at the error microphone is estimated by applying a speaker-to-error-microphone transfer function to the anti-noise signal.

14. The add-on active muffler of claim 1, wherein the outer portion has a length (L2) of approximately 150 mm.

15. The add-on active muffler of claim 1, wherein:
the inner portion and the outer portion have approximately the same width (W) and height (H), and are aligned lengthwise.

16. The add-on active muffler of claim 1, wherein:
a front side of the inner portion is open and contiguous with a corresponding open rear side of the outer portion.

17. The add-on active muffler of claim 1, wherein:
a front end of the outer portion has an exhaust opening for exhausting air to the atmosphere.

18. The add-on active muffler of claim 1, wherein:
a side surface of the outer portion has an exhaust opening for exhausting air to the atmosphere.

19. The add-on active muffler of claim 1, wherein:
a rear side of the inner portion has an intake opening for receiving air from within the chassis.

20. A method of reducing noise from a server chassis, the method comprising:
  installing an add-on duct in the server chassis, the add-on duct comprising an inner portion and an outer portion, wherein the inner portion is disposed within the server chassis,
  wherein the outer portion extends outside of the server chassis,
  providing a blower within the inner portion for drawing air from within the server chassis into the inner portion, and for moving the air through the outer portion to the atmosphere,
  providing an active noise control (ANC) system to actively reduce noise of a noise source, wherein the ANC comprises comprises:
    an input transducer to sense an acoustic noise field generated by the noise source, and to generate from the acoustic noise field an input signal;
    an output actuator to generate an acoustic output field effective to reduce a level of the acoustic noise field;
    a correction unit to adjust the input signal to compensate for characteristics of the input transducer and the output actuator;
    an echo canceller to remove from the input signal a portion of the output of the output actuator, which comprises a feedback through the input transducer, wherein an output of the echo cancellation unit represents a signal corresponding to the noise source; and
    an anti-noise generator to generate an anti-noise signal opposite in phase to the input signal by applying an adjustable prediction filer, wherein the prediction filter is adjusted based on a residual noise at a virtual error microphone, which is estimated based on a combination of an estimated error noise at the error microphone and an estimated counter noise at the error microphone,
  wherein the output actuator is to generate the acoustic output field from the anti-noise signal.

21. The method of claim 20, wherein providing the input transducer comprises providing at least one microphone for monitoring noise within the add-on duct;
  wherein providing the anti-noise generator comprises providing at least one speaker for emitting anti-noise;
  wherein providing the active noise control (ANC) system further comprises:
    providing a variable gain amplifier to generate an amplified signal substantially 180 degrees opposite in phase from the input signal;
    providing a wireless communication unit to receive a user-generated control signal representing a user command to modify a location of a quiet zone generated by the active noise control (ANC) system; and
    providing a gain control unit to dynamically control a gain of the variable control amplifier based on said user-generated control signal,
  and wherein the active noise control (ANC) system is adapted to actively reduce noise at or below 1000 Hz.

22. The method of claim 20, wherein the input transducer is mounted within the outer portion of the add-on duct.

23. The method of claim 20, wherein the input transducer is mounted within the inner portion of the add-on duct.

24. The method of claim 20, wherein the output actuator is mounted within the outer portion of the add-on duct.

25. The method of claim 20, wherein the output actuator is mounted within the inner portion of the add-on duct.

26. The method of claim 20, wherein:
the inner portion is formed of sheet metal.

27. The method of claim 20, wherein:
the outer portion is formed of a sound-absorbing material.

28. The method of claim 20, wherein:
the estimated error noise at the error microphone is estimated by applying a reference-microphone-to-error-microphone transfer function to the input signal, and wherein the estimated counter noise at the error microphone is estimated by applying a speaker-to-error-microphone transfer function to the anti-noise signal.

29. The method of claim 20, wherein:
the active noise control (ANC) system is adapted to shift noise to a frequency which can be absorbed by the passive materials.

* * * * *